US006550026B1

(12) United States Patent
Wright et al.

(10) Patent No.: US 6,550,026 B1
(45) Date of Patent: Apr. 15, 2003

(54) HIGH SPEED TEST SYSTEM FOR A MEMORY DEVICE

(75) Inventors: Jeffrey P. Wright, Boise, ID (US); Hua Zheng, Boise, ID (US); Paul M. Fuller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/724,346

(22) Filed: Nov. 27, 2000

Related U.S. Application Data (63) Continuation of application No. 09/321,295, filed on May 27, 1999, now Pat. No. 6,154,860, which is a continuation of application No. 08/779,036, filed on Jan. 6, 1997, now Pat. No. 5,966,388.

(51) Int. Cl.$^7$ .............................................. G11C 29/00
(52) U.S. Cl. ................... 714/719; 365/189.04; 365/201
(58) Field of Search ................................ 714/719, 718; 365/201–200, 185.03, 189.07, 189.04, 230.05, 207

(56) References Cited

U.S. PATENT DOCUMENTS

| | | | |
|---|---|---|---|
| 4,369,511 A | 1/1983 | Kimura et al. ............... 714/718 |
| 4,958,345 A | 9/1990 | Fujisaki ....................... 714/720 |
| 5,075,892 A | 12/1991 | Choy ............................ 382/61 |
| 5,301,155 A | 4/1994 | Wada et al. .................. 365/201 |
| 5,303,192 A | 4/1994 | Baba ............................ 365/200 |
| 5,353,253 A | 10/1994 | Nakajima .................... 365/200 |
| 5,396,124 A | 3/1995 | Sawada et al. ................ 326/13 |
| 5,400,342 A | * 3/1995 | Matsumura et al. ......... 365/200 |
| 5,406,566 A | 4/1995 | Obara .......................... 714/719 |
| 5,422,892 A | 6/1995 | Hii et al. ...................... 714/735 |
| 5,430,679 A | 7/1995 | Hiltebeitel et al. .......... 365/200 |
| 5,446,693 A | 8/1995 | Okamoto ..................... 365/200 |
| 5,457,696 A | 10/1995 | Mori ............................ 714/720 |
| 5,483,493 A | 1/1996 | Shin ............................. 365/201 |
| 5,528,539 A | 6/1996 | Ong et al. .................... 365/200 |
| 5,537,665 A | 7/1996 | Patel et al. ............... 395/182.03 |
| 5,539,702 A | 7/1996 | Ahn ............................. 365/210 |
| 5,677,887 A | * 10/1997 | Ishibashi et al. ............. 365/205 |
| 5,687,387 A | 11/1997 | Endejan et al. .............. 395/822 |
| 5,701,441 A | 12/1997 | Trimberger ................... 395/500 |
| 5,706,234 A | 1/1998 | Pilch, Jr. et al. ............. 365/201 |
| 5,768,287 A | * 6/1998 | Norman et al. .............. 714/719 |
| 5,777,932 A | * 7/1998 | Chonan .................. 365/189.01 |
| 5,925,142 A | 7/1999 | Raad et al. ................... 714/719 |
| 5,966,388 A | * 10/1999 | Wright et al. ................ 714/719 |

FOREIGN PATENT DOCUMENTS

EP            0 578876 A1      1/1994

* cited by examiner

Primary Examiner—Albert Decady
Assistant Examiner—Guy Lamarre
(74) Attorney, Agent, or Firm—Dorsey & Whitney LLP (57) ABSTRACT

A memory device requires a minimum of two input/output lines from an external testing device to be coupled thereto. A first DQ line from the memory device provides a direct data path from the array so that the external tester can read data from the array at the maximum speed of the memory device. Test mode circuitry for multiplexing and comparing multiple DQ lines during address compression mode is coupled to two or more DQ lines, including the first DQ line. The compression mode testing circuitry can include on-chip comparators that compare the data simultaneously written to, and read from, the memory device. The comparison circuitry outputs a data test flag indicating whether or not the data read from the memory device matches. The test flag is output through a multiplexer to a second DQ line. As a result, the speed of the device can be tested from the first DQ line, while the results of on-chip comparison can be sampled at the second DQ line.

The compare circuitry compares not only bits of a given data word, but also at least one bit from another data word. Therefore, rather than employing two compare circuits that compare first and second data words, and a third compare circuit that compares the results of the first two compare circuits, the present invention avoids the need for the third compare circuit by comparing the first data word in a first compare circuit with at least one bit from the second data word.

10 Claims, 4 Drawing Sheets

HIGH SPEED TEST SYSTEM FOR A MEMORY DEVICE

CROSS-REFERENCE TO RELATED APPLICATION

This application is a continuation of U.S. patent application Ser. No. 09/321,295, now U.S. Pat. No. 6,154,860 filed May 27, 1999, which is a continuation of U.S. patent application Ser. No. 08/779,036, filed Jan. 6, 1997, and Issued Oct. 12, 1999 as U.S. Pat. No. 5,966,388.

TECHNICAL FIELD

This invention relates generally to computers, and more particularly to memory devices and methods of testing such devices.

BACKGROUND OF THE INVENTION

Computer designers desire fast and reliable memory devices that will allow them to design fast and reliable computers. Manufacturers of memory devices, such as random access semiconductor memories, must test a full range of functionality and timing characteristics of the memory devices in order to provide a reliable product to their customers. Because each memory cell of the device must be tested, the time and equipment necessary for testing memory devices having increasing density represents a significant portion of the overall manufacturing cost of such devices. Any reduction in the time to test each unit will reduce manufacturing costs.

Semiconductor manufacturers have developed fast testing routines to allow a greater number of chips to be tested simultaneously using a given testing device. One known testing routine, Jedec, simply compares the data written to a memory device with the data read from that memory device, and assigns a 1 value to one or more memory cell addresses if the data matches (passes), or a 0 if the data does not match (fails). While the Jedec routine is fast, it does not output the actual data written to the memory device. As a result, if the tester outputs a continuous string of 1 s, indicating that the memory device passes, a technician is unsure whether the device actually passes, or if an error has occurred in the device, or at some point along the path from the device to the tester, to cause such an output.

To compensate for this shortcoming of the Jedec routine, a Micron Test Mode Routine provides three outputs. The Micron Routine outputs the actual data, as a 0 or a 1, and a mid-level tri-state value therebetween. If the tri-state value is output, rather than a 1 or a 0, the technician recognizes that an error has occurred. Unfortunately, while the Micron Routine provides superior testing of most semiconductor devices, the routine typically cannot bias the output back to the tri-state value before the beginning of the next read/write cycle rapidly enough to allow current high-speed memory devices to be tested at their normal operating speed. As a result, such high-speed memory devices must be tested at speeds slower than their typical operating speed.

To save testing time and cost, manufacturers of memory devices increasingly automate the testing procedure so that a tester applies the testing routine simultaneously to several chips. Automated testing is most easily accomplished after the memory device has been packaged as a semiconductor chip, because the chip can be automatically inserted into a test socket using pick and place machinery. Automated testing circuitry then performs the testing routine by applying predetermined voltages and signals to the chip, writing test data patterns to the memory, reading data, and analyzing the results to detect memory speed, timing, failures, etc. The more chips that can be tested simultaneously, the greater testing time savings per chip.

Most testers used in testing semiconductor chips are expensive. For example, a current tester manufactured by Teradyne has 128 input/output ("I/O") lines. To maximize the number of chips that this tester can test simultaneously, the on-chip data input/output lines, or "DQ lines," are multiplexed so that fewer I/O lines from the tester are required to be coupled to each chip. For example, the tester writes a predetermined data pattern simultaneously to multiple locations in each memory device and then accesses the written data during a read cycle. Comparator circuits fabricated on-chip compare the data read from the multiple locations and indicate whether all the data read matches the data written. If the chip has 32 DQ lines (DQ0–DQ31), on-chip 4:1 multiplexers and testing circuitry compress data onto only 8 of the 32 DQ lines. As a result, only 8 of the 128 lines of the tester are required for each chip. Consequently, the tester's 128 I/O lines can simultaneously test 16 chips.

In another solution, certain semiconductor memory devices, manufactured by Micron Technology, Inc., provide on-chip test mode circuitry that helps compensate for such delays during testing of devices. Under such test mode circuitry, the external testing device writes data to the chip during a first interval, and then writes the same data again to the DQ lines during a second interval. During the second interval, while the data is written again to the DQ lines, the data previously written to the memory device is read therefrom and latched. On-chip comparators then compare the latched data to the data written during the second interval. If the latched data equals the data written during the second interval, then the chip passes. Such a device can rapidly analyze the read data written to the device.

While the above solutions can detect for typical cell-to-cell defects and functionality of the chip, they cannot accurately test the speed of the chips. As semiconductor memory chips provide increasingly faster data I/O rates, particularly with synchronous DRAMs, data is required to be transferred to and from the chips in as little as 9 nanoseconds or less, based on a 10-nanosecond or faster clock cycle. As a result, such chips provide only a 1-nanosecond margin of error. Today's increasingly fast memory devices require highly precise generation of timing signals and precise measurement of the memory device's response thereto. Gate delays caused by the multiplexing circuitry required during testing cause the data to be read from the chips in greater than 10 nanoseconds. As a result, the tester cannot determine if the chip accurately output data within the required 9 nanoseconds. In other words, the on-chip testing circuitry prohibits the tester from testing the speed of such chips.

Obviously, it is desirable to determine the performance, and thus the speed of, semiconductor memory chips, especially high-speed chips. Additionally, because of manufacturing process tolerance and variations, one memory device of a particular design may be faster than another memory device of the very same design. Manufacturers therefore typically also desire to test the speed of such chips so that such chips can be sorted based on speed grades. To provide such speed testing, typical address compression mode testing, and on-chip multiplexing of DQ lines, must be abandoned. As a result, where 16 or more chips could previously be simultaneously tested using multiplexing, only 4 of such chips can be simultaneously speed tested because all 32 DQ lines of each chip must be coupled to the tester's I/O lines. As a result, there is a need to simultaneously speed test an increasing number of chips using a given tester.

One solution has been to purchase a larger number of testers, or more expensive testers having a greater number of I/O lines. However, as noted above, such testers are quite expensive.

SUMMARY OF THE INVENTION

The present invention provides a semiconductor device that can be efficiently speed tested, and which overcomes at least the shortcomings of the prior art discussed above. The memory device requires, at a minimum, only two I/O lines from an external testing device to be coupled thereto. A first DQ line from the memory device provides a direct data path from the array so that the external tester can read data from the array at the maximum speed of the memory device. Test mode circuitry for multiplexing and comparing multiple DQ lines in address compression mode is coupled to two or more DQ lines, including the first DQ line. The compression mode testing circuitry can include on-chip comparators that compare the data simultaneously written to, and read from, the memory device. The comparison circuitry outputs a data test flag indicating whether the data read from the memory device matches or whether the data does not match. The test flag is output through a multiplexer to a second DQ line. As a result, the speed of the device can be tested from the first DQ line, while the results of on-chip comparison can be sampled at the second DQ line. Importantly, the external testing device need not read the data from the first DQ line simultaneously with the test data flags from a second DQ line.

The present invention also embodies a method of reducing the number of compare circuits required in on-chip test circuitry. To reduce the number of exclusive OR gates, and thereby realize increased surface area on the die, compare circuits compare not only bits of a given data word, but also at least one bit from another data word. Therefore, rather than employing two compare circuits that compare first and second data words, and a third compare circuit that compares the results of the first two compare circuits, the present invention avoids the need for the third compare circuit by comparing the first data word in a first compare circuit with at least one bit from the second data word.

In a broad sense, the present invention embodies a semiconductor memory device having a plurality of memory cells, at least first and second output terminals, a control circuit, a test circuit and a data path or switch. The plurality of memory cells are operable to store data therein, and include first and second sub-arrays of memory cells. The first and second output terminals are coupled to the first and second sub-arrays, respectively. The control circuit is coupled to the first and second sub-arrays and is operable to transfer data from the first and second sub-arrays to the first and second output terminals, respectively.

The test circuit is coupled to the control circuit and to the first and second sub-arrays. The test circuit, in response to a test mode signal from the control circuit, tests data written to the first sub-array and outputs a test signal based on the testing. The switch receives the test mode signal from the control circuit and couples the test circuit to the first output terminal in response thereto. As a result, the test signal can be provided to the first output terminal, while data stored in the second sub-array can be provided to the second output terminal during the testing.

Additionally, the present invention embodies a method of testing a semiconductor memory device having at least first and second sub-arrays of memory cells. The method includes the steps of: (a) entering into a test mode; (b) writing data to the first and second sub-arrays; (c) testing the data written to the first sub-array; (d) providing a test signal indicating the results of the testing; (e) selectively providing the test signal to an output terminal when the memory device is in the test mode; and (f) reading the data from the second sub-array and providing the data to a second output terminal.

Moreover, the present invention embodies a semiconductor memory device having a plurality of memory cells, a control circuit and a test circuit. The plurality of memory cells include first and second sets of sub-arrays of memory cells, each set having eight sub-arrays corresponding to a data word. The control circuit is coupled to the plurality of memory cells and is operable to write data to, and read data from, the plurality of memory cells.

The test circuit has first and second compare circuits. The first compare circuit compares bits in a first data word written to the first set of sub-arrays to each other and outputs a pass value for a test signal if all of the bits in the first data word match. The second compare circuit compares bits in a second data word written to the second set of sub-arrays to each other and to at least one bit from the first data word, and outputs a pass value for the test signal if all of the bits of the second data word and the one bit from the first data word match.

DETAILED DESCRIPTION OF THE PREFERRED EMBODIMENT

Figure 1:
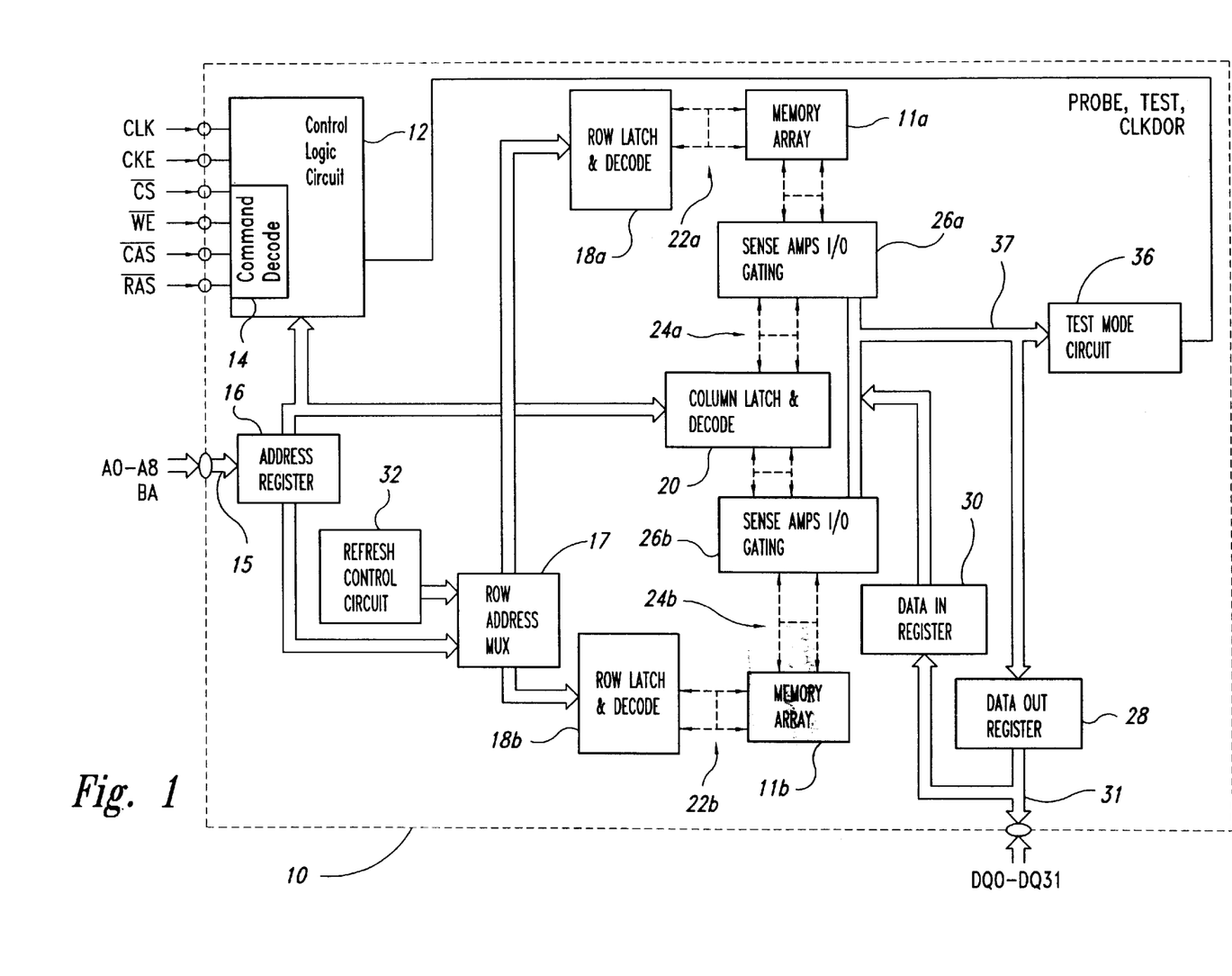
FIG. 1 is a block diagram showing a memory device having a test mode circuit according to the present invention.

FIG. 1 shows a block diagram of the preferred embodiment of a memory device 10 according to the present invention. The memory device 10 is a synchronous dynamic random access memory (SDRAM) device that includes as its central memory element left and right memory array banks 11A and 11B. Each of the memory arrays 11A and 11B includes a plurality of memory cells (not shown) arranged in rows and columns. A control logic circuit 12 controls the data transfer steps associated with a read or write access to the memory cells in the arrays 11A and 11B. In one embodiment, each of the arrays 11A and 11B has memory cells arranged in 512 rows by 256 columns by 32 bits. The memory device 10 has a width of 32 bits—meaning that each memory address (combined bank, row and column address) corresponds to a respective 32-bit memory cell in one of the arrays 11A and 11B, and a processor (not shown in FIG. 1) operates on data elements of 32 bits each.

A system clock (not shown) provides a CLK signal to the control circuit 12 of the memory device 10. Command signals are provided to the control circuit 12 and decoded by command decode circuitry 14. These signals are well known in the art, and include signals such as CKE (clock enable), CS (chip select), WE (write enable), RAS (row address strobe) and CAS (column address strobe). Distinct combinations of the various command signals constitute distinct processor commands. For example, the combination of CS low, WE high, RAS low and CAS high can represent an ACTIVE command. Examples of other well-known commands include READ, WRITE, NOP and PRECHARGE. Although the processor actually produces distinct command signals that in combination are registered and decoded as commands by the memory device 10, it is convenient to refer to these commands as being issued by the processor.

The control circuit 12 sends control signals on control lines (not shown) to other parts of the memory device 10, corresponding to the processor-issued command. These control signals control the timing of access to the memory cells in arrays 11A and 11B. The memory device 10 is also provided with an address of the memory location to be accessed on a 10-bit wide address bus 15, including a bank address specified by address bit BA and a row or column address specified by address bits A0–A8. The address is input to an address register 16 which provides the address information to the control circuit 12, a row-address mux 17, and a column-address latch and decode circuit 20.

In response to one or more control signals provided by the control circuit 12, the row-address mux 17 multiplexes row address information and provides it to one of two row-address latch and decode circuits 18A and 18B corresponding to the memory banks 11A and 11B to be accessed. In response to one or more control signals provided by the control circuit 12, each of the row latch and decode circuits 18A and 18B takes a row address provided by the row-address mux 17 and activates a selected row of memory cells (not shown) in the memory array 11A and 11B by selecting one of several row access lines 22A and 22B, respectively. In response to one or more control signals provided by the control circuit 12, the column latch and decode circuit 20 takes a column address provided by the address register 16 and selects one of several column access lines 24A and 24B, each of which is coupled to one of the memory arrays 11A and 11B by one of two I/O interface circuits 26A and 26B, respectively. In response to one or more control signals provided by the control circuit 12, each of the I/O interface circuits 26A and 26B selects the 32 memory cells corresponding to the column location in an activated row.

The I/O interface circuits 26A and 26B include sense amplifiers which determine and amplify the logic state of the selected memory cells. The I/O interface circuits 26A and 26B also include 110 circuits that gate data to 32 data output registers 28 and from a data input register 30, responsive to one or more control signals provided by the control circuit 12. The data registers 28 and 30 are connected to a 32-bit wide data bus 31 at DQ pads DQ0–DQ31 to transfer output data Q0–Q31 to a processor and input data D0–D31 from a processor, responsive to one or more control signals provided by the control circuit 12.

The memory device 10 includes a refresh control circuit 32 which, responsive to one or more control signals provided by the control circuit 12, initiates regular and periodic activation of each of the rows of the memory cells in the arrays 11A and 11B for purposes of data refresh, as is well known in the art. In response to one or more control signals provided by the control circuit 12, a respective one of the I/O interface circuits A and B senses data stored in the memory cells of the refresh-activated row and rewrites values corresponding to the stored data in each of the memory cells.

The memory device 10 is preferably formed on a single semiconductor substrate or die. Several output terminals or pads, electrically coupled to the address lines A0–A9, DQ lines DQ0–DQ31, and other lines, can be formed at the periphery of the die. The die is preferably encapsulated by a protective material to form a packaged chip, and several electrically conductive leads or pins, which are electrically coupled to the pads, extend from the chip (not shown in FIG. 1).

The memory device 10 also includes a test mode circuit 36 coupled to an internal data output bus 37 connecting the I/O interface circuits 26A and 26B to the output register 28. The test mode circuit 36 is enabled by the control circuit 12 when the control circuit has received instructions, in the form of a special "address" of test key vector received by the control circuit 12 and indicating that the memory device is to be operated in a test mode. In particular, when the control circuit 12 is instructed to operate the memory device 10 in the speed test mode, the control circuit provides a test-enable signal TEST that enables the test mode circuit 36 to perform testing of the memory device. The test mode circuit 36 provides a comparison signal or test data flag to the data output registers 28.

Figure 2:
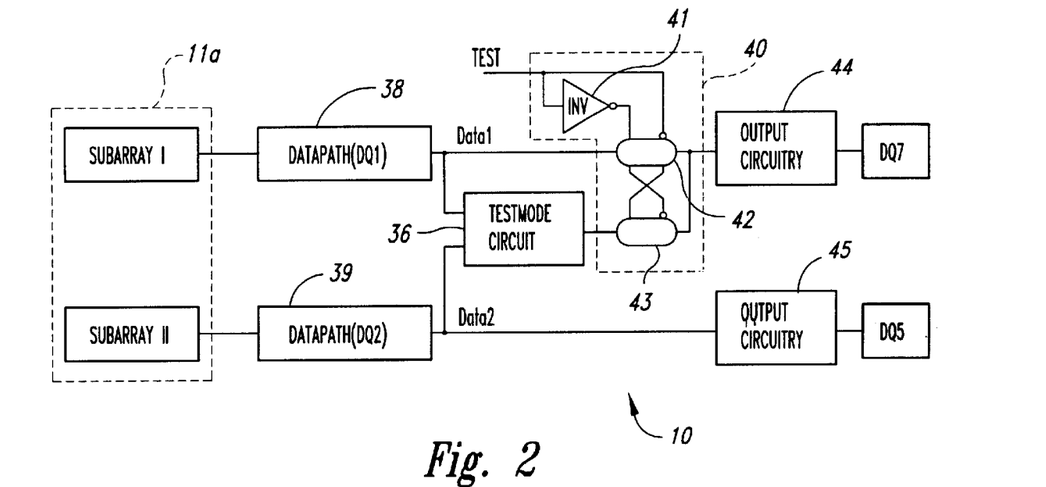
FIG. 2 is a block diagram showing details of the test mode circuit and associated circuitry of the memory device of FIG. 1.

Referring to FIG. 2, the left array 11A is shown diagrammatically as having two sub-arrays, sub-array I and sub-array II. The sub-arrays I and II receive incoming data, or outgoing data, through data paths 38 and 39, respectively. The data paths 38 and 39, shown in the block diagram of FIG. 2, represent much of the circuitry coupled between the array 11A and the data output registers 28, including the sense amplifiers, gating and I/O circuits 26A. The data paths 38 and 39 are used during both normal and test mode operation of the memory device 10, and therefore represent the standard delays inherent between all of the DQ lines and the arrays.

For reasons of simplicity and clarity, only two sub-arrays for the array 11A, and two DQ lines, DQ5 and DQ7, are shown in FIG. 2. The memory device 10, however, has 32 sub-arrays and data paths corresponding to the 32 DQ lines DQ0–DQ31. As explained more fully below, the 32 sub-arrays are divided into four groups of 8 sub-arrays each, where each group outputs 1 bit to form an 8-bit word for each external address applied to the memory arrays 11A and 11B. Therefore, for each external address, four data words can be output. The test mode circuitry 36 compares bits of each word together (e.g., compares the even bits together and the odd bits together for each group of 8 sub-arrays), and outputs a test data flag to at least one DQ line for each group (e.g., DQ line DQ6). At least one other DQ line can then directly output the data to the same or an additional DQ pad to allow both the test data flags on line DQ6 and direct data to be output by the memory device 10.

As shown in FIG. 2, the test mode circuit 36 receives the outputs from the data paths 38 and 39, compares the data from the sub-arrays I and II, and outputs the test flag to a switch, such as 2:1 multiplexer 40. The multiplexer 40 receives the TEST signal from the control circuit 12, inverts the signal through an inverter 41 and provides both the inverted and non-inverted test signal to a pair of cross-coupled passgates 42 and 43. The first passgate 42 receives the data from the data path 38, while the second passgate 43 receives the test data flag from the test mode circuit 36. If the incoming TEST signal has a high value, then the test data flag from the test mode circuit 38 is passed by the passgate 43, while if the TEST signal has a low value, the data from the data path 38 is output by the passgate 42. Output circuitry 44 receives the output from the multiplexer 40, and is coupled at its output to the DQ pad DQ7. The output circuitry 44 includes output amplifiers, one of the data output registers 28, etc. The output circuitry 44 primarily includes standard circuitry required to provide data to, and receive data from, the DQ pad DQ7. Therefore, the output circuitry 44 contains standard delays inherent in such circuitry, and which exist along all DQ lines in the memory device 10. Except as explained below, essentially the only delays along the DQ7 path, which differ from other DQ paths, are caused by the multiplexer 40 and test mode circuitry 36.

Output circuitry 45, substantially identical to output circuitry 44, is coupled between the DQ pad DQ5 and the data path 39. Importantly, data transferred to and from the sub-array II is transferred to and from standard circuitry between the array and the DQ pad DQ5, i.e., the data path 39 and the output circuitry 45. Therefore, an external testing device can write data to, and read data from, the sub-array II and accurately determine the speed of the memory device 10, since no additional circuitry is provided along the DQ5 line, namely the test mode circuitry 136 and multiplexer 40. Additionally, as noted above, the external testing device can also determine if the test mode circuitry 36 has determined an error by reading the test flag from the DQ7 line. Consequently, the external testing device can determine the speed of the memory device 10 and determine the data read from the memory device from the DQ5 line, while also determining whether the test mode circuitry 36 has detected an error from the DQ7 line.

Since the test data flag from the test mode circuitry 36 is provided at the DQ7 line, the test data flag can be detected by the external testing device at a time subsequently to the reading of the data from the DQ5 line. Therefore, while the test mode circuitry 36 and multiplexer 40 provide additional gate delays for the test data flag output on the DQ7 line, such delays are irrelevant to determining the speed the memory device 10, since the speed can be determined from one of the other DQ lines, e.g., DQ5.

The test mode circuitry 36 writes the same data values to the memory arrays 11A and 11B, compares the bytes of data, and outputs a low value if all of the bits in the bytes match, as explained below. While rare, it is possible that all of the data read from one of the memory arrays in a given byte is erroneous, but that the test mode circuitry nevertheless outputs a low or match signal for the data test flag indicating that the memory device 10 passed the test. However, since the actual data written to the array is also output from the DQ5 pad, the external testing device can compare the data read on the DQ5 pad to the data which it previously wrote to the device to determine if the two match. If they do not match, then the testing device will recognize this error.

Figure 3:
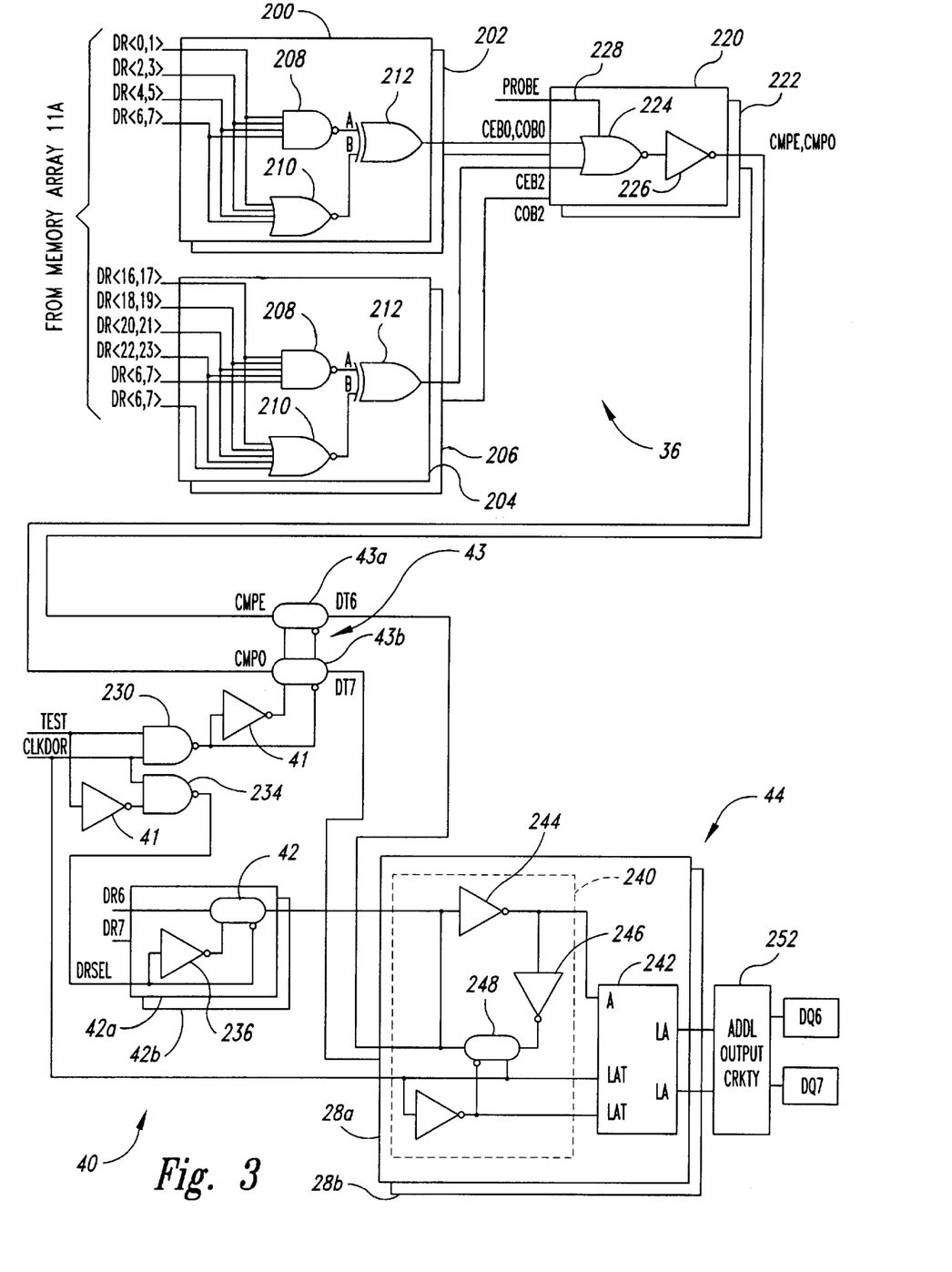
FIG. 3 is schematic diagram of the test mode circuit and related circuitry of the memory device of FIG. 1.

Referring to FIG. 3, the test mode circuit 36 includes four comparison circuits 200, 202, 204, and 206. (Only two of the four comparison circuits, comparison circuits 200 and 204, are shown in FIG. 3.) Each of the compare circuits 200–206 includes a NAND gate 208 and a NOR gate 210 that each receive a signal DR representing data read from the memory arrays 11A and 11B. The NAND gate 208 and the NOR gate 210 of the compare circuit 200 receives the data read from the sub-arrays associated with DQ lines DQ0, DQ2, DQ4 and DQ6, while the NAND and NOR gates for the compare circuit 202 receives the data read from the sub-arrays associated with DQ lines DQ1, DQ3, DQ5 and DQ7. In other words, the compare circuit 200 compares the even bits of a first 8-bit data word (DQ0–DQ7) to each other, while the compare circuit 202 compares the odd bits from the first data word to each other. The NAND gate 208 and NOR gate 210 of the compare circuit 204 receives the data read from the sub-arrays associated with DQ lines DQ16, DQ18, DQ20, DQ22 and DQ6, while the NAND and NOR gates for the compare circuit 206 receives the data read from the sub-arrays associated with DQ lines DQ17, DQ19, DQ21, DQ23 and DQ7. In other words, the compare circuit 204 compares the even bits of a third data word DQ16–DQ23, while the compare circuit 206 compares the odd bits of this data word. While such comparison is divided by even and odd bits, other divisions of the words or DQ lines could be employed. The compare circuits 204 and 206 also compare 1 bit from the first data word (i.e., DQ6 and DQ7) to bits of the third data word to reduce area on the die, as explained below.

The outputs of the NAND and NOR gates 208 and 210 are input to an exclusive OR gate 212 in each of the compare circuits 200–206. The NAND and NOR gates 208 and 210 both output a high value if all of their inputs are low, and alternatively both output a low value if all of their inputs are high. In response thereto, the exclusive OR gates 212 output a low value only if both of their inputs are either high or low. Therefore, if any of the inputs to the NAND or NOR gates are not equal to the remaining inputs, then the exclusive OR gates 212 will not output a low value.

As is known, exclusive OR gates require a greater amount of surface area on the die than NAND or NOR gates. Typically, prior on-chip testing circuitry for semiconductor memory devices employed an additional comparison circuit that compared two compared data words. For example, such prior systems employed another comparison circuit, having at least one more exclusive OR gate, that would compare the outputs from the exclusive OR gates 212 to thereby compare the first data word with a third data word. Since during address compression testing, a single bit is written to all DQ lines DQ0–DQ31, the two compared words should match.

The present invention, however, avoids the need for such an additional comparison by instead comparing 1 bit from the first byte to the entire third byte. Therefore, to reduce the number of exclusive OR gates, and thereby realize increased surface area on the die, the compare circuits 204 and 206 compare not only the even and odd bits of the third data word to each other, but also a bit from the first data word, e.g., DQ6 and DQ7, respectively. Therefore, the NAND and NOR gates 208 and 210 of the compare circuit 204 receive not only the even bits of the third byte, but also the last even bit from the first byte, i.e., DQ6. Similarly, the compare circuit 206 compares the even bits of the third byte, DQ17, DQ19, DQ21 and DQ23, to the most significant odd bit of the first byte, DQ7.

If all of the bits written to DQ lines DQ16–DQ23 in the third data word, and the bits DQ6 and DQ7 written to the first data word all have the same value, then the NAND and NOR gates 208 and 210 of the compare circuits 204 and 206 all output low values to the exclusive OR gates 212. The additional comparison required in the prior art test circuits is avoided because all of the bits in the first word and all of the bits in the third word must be all 0's or all 1's for the exclusive OR gate 212 to output a low value. In theory, the exclusive OR gate 212 could output a low value if all of the bits in the first word were all logic 0's and all of the bits in the third word were all logic 1's (or vice versa). However, by comparing one bit from the first word to the bits of the third word, the exclusive OR gate 212 can output a low value only if the bits of the first and third words are all identical. As a result, this comparison effectively compares the third data word to the first data word. While not as robust as comparing each bit in the actual data words, the present invention provides a good substitute and reduces die area.

If the data read signals DR output on the DQ lines DQ0–DQ7 and DQ16–DQ23 all match, then the compare circuits 200 and 202 output compare even and compare odd byte 0 match signals CEB0 and COB0, and the compare circuits 204 and 206 output compare even and compare odd byte 2 signals CEB2 and COB2, all respectively. Output circuits 220 and 222, each having a 2-input NOR gate 224, receive therein the match signals CEB0 and CEB2, and COB0 and COB2, respectively. If either of the match signals has a high value, then the NOR gate 224 outputs a low signal which is inverted by an inverter 226 and output as compare even and compare odd signals CMPE and CMPO from the output circuits 220 and 222, respectively.

The NOR gate 224 in the output circuits 220 and 222 can have a disable input 228 that receives a probe signal PROBE from the control circuit 12. If the control circuit 12 outputs a high PROBE signal to the disable input 228 of the NOR gate 224, then the output circuits 220, 222 are disabled, and do not output the compare signals CMPE and CMPO. The disable input 228 allows the control circuit 12 to effectively disable the test mode circuit 36 when the memory device 10 is being tested in die form by probes from an external testing device coupled to the die. When so tested, external comparison circuitry overrides the test mode circuitry 36.

The passgates 43 in the multiplexing circuit 40 receive the compare signals CMPE and CMPO from the output circuits 220 and 222, respectively. As shown in more detail in FIG. 3, the passgates 43 of FIG. 2 preferably consists of a first passgate 43A that receives the compare signal CMPE, and a second passgate 43B that receives the compare signal CMPO. A NAND gate 230 in the multiplexing circuit 40 receives the test enable signal TEST and a clock data output register signal CLKDOR*. When the memory device 10 enters compression mode testing, the control circuit 12 outputs a high value for the test enable signal TEST to enable the NAND gate 230. Additionally, during compression mode testing, the control circuit 12 outputs the CLKDOR* signal, which is a timing signal. As a result, when high values for the CLKDOR* and TEST signals are input to the NAND gate 230, the passgates 43A and 43B close to output the compare signals CMPE and CMPO as data test flags DT6 and DT7, respectively. When the memory device 10 is not in the compression test mode, then the control circuit 12 outputs a low value for the TEST signal, which causes the NAND gate 230 to always output a high value, which in turn causes the passgates 43A and 43B to open and not output the compare signals CMPE and CMPO.

A second NAND gate 234 receives the inverted TEST signal and the CLKDOR* signal, and outputs a data read select signal DRSEL*. The NAND gate 234 is disabled to output a low value for the DRSEL* signal when the TEST signal is high. When the TEST signal is low, the NAND gate 234 is enabled so that it passes the clock data output register signal CLKDOR* in inverted form as a low data read select signal DRSEL*. The data read select signal DRSEL* is then inverted by an inverter 236 and the inverted and noninverted DRSEL* signals are used to switch the passgate circuits 42A and 42B, respectively, of the multiplexer 40. The passgate circuits 42A and 42B receive and pass the data signals read from the DQ lines DQ6 and DQ7, respectively, under normal operation of the device 10, when not in test mode and the TEST signal is low.

The output of the passgate circuits 42A and 42B are input to data output registers 28A and 28B, respectively, where each data output register has a slave latch 242 and a master latch 240 formed by two inverters 244, 246 connected in a loop when a passgate 248 is closed by CLKDOR* being low. The slave latch 242 is of known construction. Under normal operation, when the TEST signal is low, then the low data read select signal DRSEL* closes the passgates 42 to allow the data read signals DR from the DQ lines to be input to the master latch 240 in the data output latch 28. During compression test mode, however, the TEST signal is high, which causes the data read select signal DRSEL* to open the passgates 42A and 42B, thereby allowing the data test flags DT6 and DT7 to be input to the master latch 240 from the passgates 43A and 43B. Therefore, the master latches 240 in the data output registers 28A and 28B have a selectable input—either the data read signals from the DQ lines are input therein if the passgates 42 are closed, or the data test flags are input therein if the passgates 43 are closed.

As noted above, 32 data output registers 28 are employed, one for each of the 32 DQ lines DQ0–DQ31. Each of the data output registers has a master latch and a slave latch, similar to the output latches 28A and 28B of FIG. 3. Four of the data output registers 28, however, have switchable inputs, two of which are shown in FIG. 3 as data output registers 28A and 28B that receive either the data read from DQ lines DQ6 and DQ7, or the data test flags DT6 and DT7, respectively. The remaining two data output registers that have switchable inputs are coupled to DQ lines DQ23 and DQ24, as discussed below.

During test mode operation, when the CLKDOR* signal is high, the passgates 43A and 43B are closed to allow the test flag signal DT6 and DT7 to be input to the data input A of the slave latch 242, through the first inverter 244 of the master latch 240. Since the TEST signal is high, the inverter 41 always inputs a low value to the NAND gate 234, thereby providing a constant high value for the data read select signal DRSEL*, which opens the passgate 42 and prohibits the data read signals DR from being output to the master latch 240.

Thereafter, when the CLKDOR* signal is low, the passgate 248 opens, and the passgates 43A and 43B similarly open. As a result, the test data flags DT6 and DT7 are latched in the master latch 240, as it loops through the first and second inverters 244 and 246. The clock data output register signal CLKDOR* is input to the inverted clock input LAT* of the slave latch 242 (and simultaneously inverted by an inverter and input to the non-inverted clock input LAT). Therefore, when the CLKDOR* signal goes low, the data in the master latch 240 is clocked into the slave latch 242. As a result, the master latch 240 holds its output value for a clock cycle of the CLKDOR* signal, and inputs this value to the data input A of the slave latch 242, until the CLKDOR* signal transitions again. The slave latch 242 similarly holds its output value for a clock cycle of the CLKDOR* signal. As a result, additional output circuitry 252, such as output drivers and gates, can sense and amplify the data output from the slave latch 242 to the corresponding DQ pad (e.g., pads DQ6 and DQ7). The operation of the master and slave latches 240, 242 are identical for the data read signal DR input, when the passgates 43A and 43B are open and the passgate 42 is closed. In summary, the data output latch 28 has a typical master-slave latch configuration, except that it has a switchable input due to the passgates 42A, 42B, 43A and 43B.

To summarize the operation of the test node circuitry 36, multiplexer 40 and output circuitry 44 in FIG. 3, the compare circuits 200 and 202 compare the even and odd bits in the first data word DQ0–DQ7, respectively, while the compare circuits 204 and 206 compare the even and odd bits for the third data word DQ16–DQ23, respectively. The compare circuits 200 and 202 output compare even and compare odd byte 0 signals CEB0 and COB0, while the compare circuits 204 and 206 output the compare even and compare odd byte 2 signals CEB2 and COB2 to output circuits 220 and 222, respectively. The output circuits 220 and 222 output compare even and compare odd signals CMPE and CMPO to passgates 43A and 43B in the multiplexer 40. When in test mode, the TEST and CLKDOR* signals are high, which close the passgates 43A and 43B, allowing the compare even and compare odd signals CMPE and CMPO to be input to the master latches 240 in data output registers 28A and 28B, as data test flags DT6 and DT7, all respectively. The slave latches 242 in the data output registers 28A and 28B clock out the data test flags DT6 and DT7 to DQ pads DQ6 and DQ7, at a rate based on the clock data output register signal CLKDOR*. If any of the even bits in the first or third data words do not match, then the compare circuits 200 and 204 and output circuit 220 provide a high value for the compare even signal CMPE, which is passed by the passgate 43A as the data test flag DT6, and output on the DQ6 pad as a test data flag. Similarly, if any of the odd bits in the first or third data words do not match, then the compare circuits 202 and 206 and output circuit 222 provide a high value for the compare odd signal CMPO, which is passed by the passgate 43B as the data test signal DT7, and output on the DQ7 pad as a test data flag.

The present invention is generally described above for providing test data flags for the first and third data words stored in the left memory array 11A. However, the present invention is equally applicable to the odd memory array for comparing the second and fourth data words DQ8–DQ15 and DQ24–DQ31 for the right memory array 11B. Therefore, while not shown, the test mode circuit 36 also includes four additional compare circuits, similar to compare circuits 200–206, that receive the data read from the right memory array 11B for the second data word on DQ lines DQ8–DQ15 and the fourth data word on DQ lines DQ24–DQ31. The second pair of compare circuits compare not only the even and odd bits of the second data word DQ8–DQ15, but also the least significant even and odd bits of the fourth data word, i.e., DQ24 and DQ25. Similarly, the test mode circuit 36 includes two additional output circuits, similar to output circuits 220 and 222, that similarly output compare signals CMPE and CMPO to multiplexing circuits 40 and data output registers 28. The test data flags for the even and odd bits for the second and fourth data words are output to DQ22 and DQ23.

Figure 4:
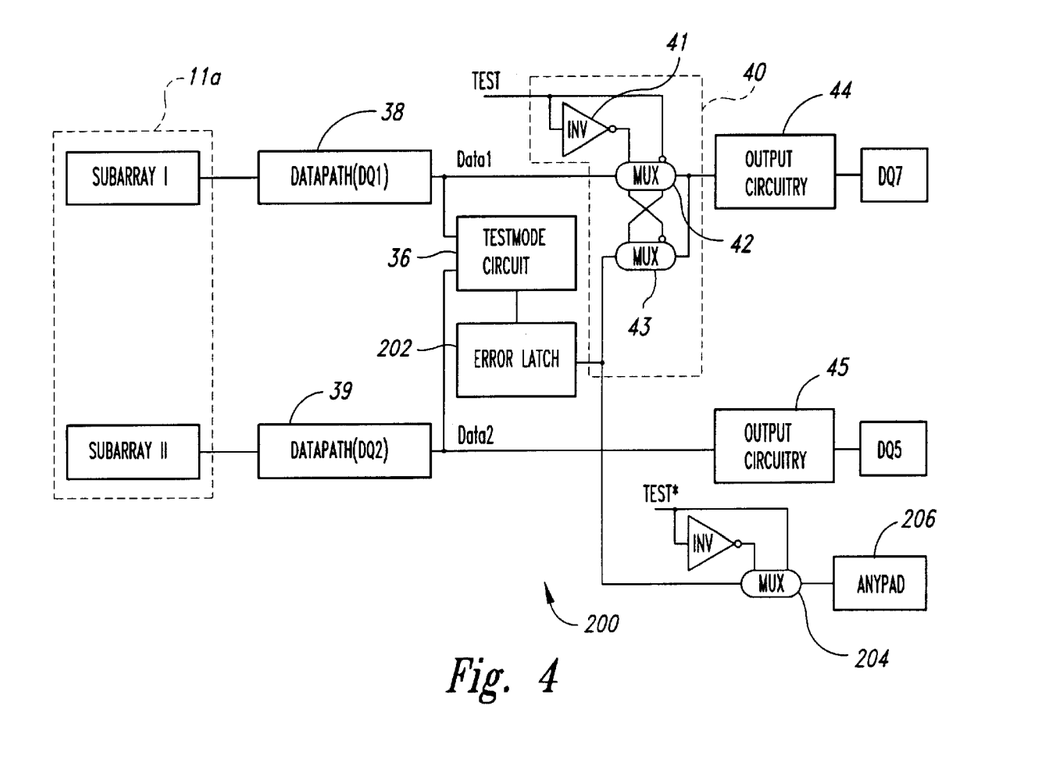
FIG. 4 is a block diagram of an alternative embodiment of the test mode circuit of the memory device of FIG. 1.

Referring to FIG. 4, an alternative embodiment of the memory device 10 is shown as a memory device 200. The alternative embodiment is similar to the previously described memory device 10, and all elements are similarly numbered when of similar construction. Only the significant differences in the construction or operation are discussed in detail.

Importantly, an error latch 202 receives and latches the compare even and compare odd signals CMPE and CMPO from the test mode circuitry 36. As a result, an external testing device can test the speed of the device from the DQ5 line, during one clock cycle, and then at some time thereafter, read the value stored in the error latch 202 from the DQ7 line. For example, during a first clock cycle, the external testing device can determine the speed of, and data from, a sub-array on the DQ7 line. Due to delays inherent in the test mode circuitry 36, error latch 202, and multiplexer 40, the testing device can then read the data latched in the error latch 202 at one or more clock cycles thereafter (e.g., two cycles thereafter). If a test data flag has been latched in the error latch 202, then the testing device can determine which memory cells in the memory array are defective by determining the addresses applied to the sub-array two clock cycles previously.

To provide a second output for the error latch 202, a multiplexer 204 is coupled between the output of the error latch and any pad 206 of the device, such as an address or additional power supply pad. Therefore, when the device 200 is in its compression test mode, a low value for the TEST signal is applied to the multiplexer 204 to cause the error latch 202 to be coupled to the additional pad 206. As a result, the multiplexer 204 frees up a DQ pad which otherwise would be used to output the test data flag. While not shown, appropriate output drivers may be required between the multiplexer 204 and the additional pad 206 so as to provide an appropriately amplified output signal for the test data flag. Such output drivers, however, need not be as large as those typically employed with standard DQ pads.

Figure 5:
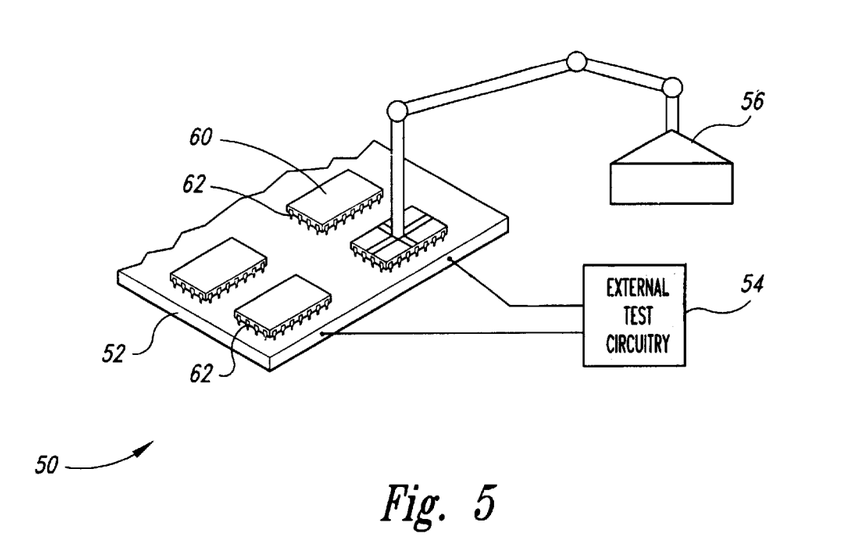
FIG. 5 is a part isometric view, part block diagram of a testing station for testing a chip containing the memory device of FIG. 1.

The present invention allows the memory device 10 to be tested when in its package chip form, to thereby be expediently tested. FIG. 5 shows a testing station 50 for testing a plurality of packaged chips 60, each containing one or more of the memory devices 10 according to the present invention. The testing station includes a test board 52 releasably holding each of the chips 60 and providing electrical connections between chip leads 62 and external test circuitry 54. Automated pick and place machinery 56 can automatically manipulate and insert the chips 60 into the test board 52.

Each of the input and output terminals of the memory device 10, such as the clock and command signal inputs, address inputs A0–A8, and data bus in/outputs DQ0–DQ31, are electrically coupled to some or all of the chip leads 62. The test circuitry 54 may include microprocessor or microcontroller circuitry, a system clock, and memory for performing testing routines and storing the results thereof. The above-described testing of memory devices 10 can be performed by the testing station 50 during various testing processes, such as during the burn-in process, when the chips 60 are subject to elevated temperatures and operating voltages. The testing can be performed at different clock speeds to identify and sort the memory devices 10 according to their respective speed grades.

Figure 6:
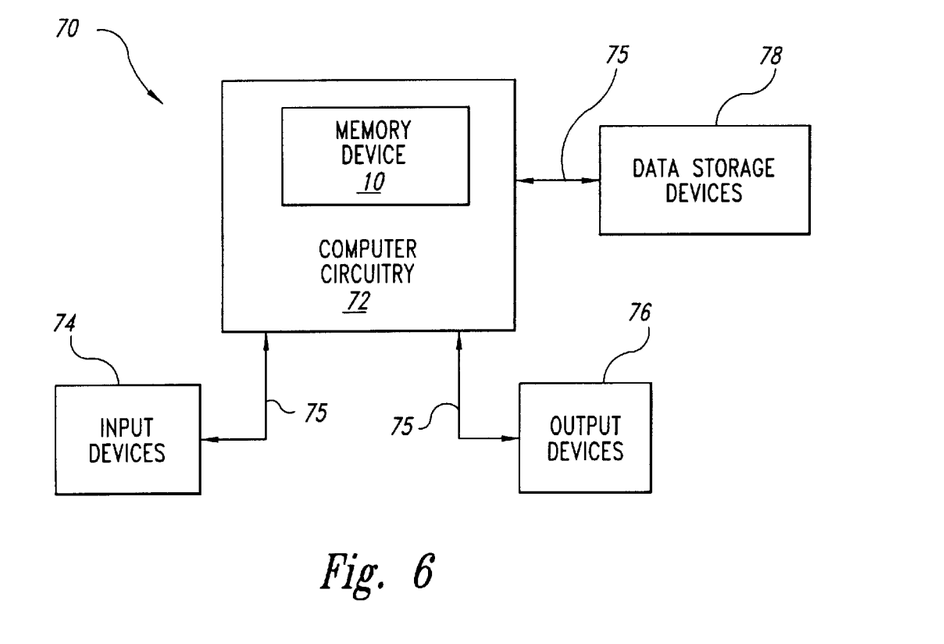
FIG. 6 is a block diagram of a computer system containing the memory device of FIG. 1.

FIG. 6 is a block diagram of a computer system 70 that uses a memory device 10 according to the present invention. The computer system 70 includes computer circuitry 72 for performing such computer functions as executing software to perform desired calculations and tasks. Circuitry 72 typically contains a processor (not shown) and the memory device 10 as shown. One or more input devices 74, such as a keyboard or a pointing device, is coupled to the computer circuitry 72 via a bus 75 and allows an operator (not shown) to manually input data thereto. One or more output devices 76 is coupled to the computer circuitry 72 via the bus 75 to provide to the operator data generated by the circuitry. Examples of output devices 76 include a printer and a video display unit. One or more data storage devices 78 is coupled to the computer circuitry 72 via the bus 75 to store data on or retrieve data from external storage media (not shown). Examples of storage devices 78 and associated storage media include drives that accept hard and floppy disks, magnetic tape recorders, and compact-disc read only memory (CD-ROM) readers.

It will be appreciated that, although embodiments of the invention have been described above for purposes of illustration, various modifications may be made without deviating from the spirit and scope of the invention. For example, while the present invention has been described as being employed in an SDRAM device, the invention is equally applicable to other semiconductor memory devices. Furthermore, while an exemplary testing routine has been described above, various other testing routines can be employed under the present invention, such as check sum testing, cyclic redundancy checks, etc. Furthermore, the test flag and data can be applied to a single output terminal, rather than two separate terminals. Moreover, the present invention is applicable to other semiconductor devices requiring rapid testing of such devices. Accordingly, the invention is not limited except as by the appended claims.

What is claimed is:

1. A method of testing a semiconductor memory device having a plurality of memory-cell arrays, each array including a plurality of memory cells, and the memory device having a plurality of output terminals, the method comprising:

placing the device into a test mode of operation;

writing test data into the memory-cell arrays;

reading the test data from the memory-cell arrays;

comparing test data read from at least one group of arrays, the group including selected ones of the plurality of arrays;

generating a respective test signal in response to the comparison for each group;

applying each test signal on a respective output terminal of the memory device; and while the operations of comparing through applying are occurring, applying the test data read from at least one of the arrays on an output terminal.

2. The method of claim 1 wherein each group of arrays provides a corresponding data word, each array in the group providing one bit of the data word, and wherein comparing the test data read from at least one group of arrays comprises comparing all the even bits in the words to each other and comparing all the odd bits in the word to each other.

3. The method of claim 2 wherein comparing for selected groups further comprises comparing at least one bit from the data word associated with a different group to determine for each selected group whether the bits in the selected and different group are equal.

4. The method of claim 1, further comprising reading the test data applied on the output terminals and thereafter reading the test signals from the output terminals.

5. A method of testing a semiconductor memory device having a plurality of memory-cell arrays, each array including a plurality of memory cells, and the memory device having a plurality of output terminals, the method comprising:

transferring test data into the memory cells; and testing the memory cells;

generating test signals indicating whether the tested memory cells have any defects; and providing the test data from at least some of the memory cells on the output terminals and at the same time providing test signals on the output terminals.

6. The method of claim 5 wherein testing the memory cells comprises comparing the data from groups of memory arrays, and for at least some of the groups comparing at least one bit of data from another group to the data from the group.

7. A method of testing a semiconductor memory device having a plurality of memory cells and the memory device having a plurality of output terminals, the method comprising:

placing the device into a test mode of operation;

writing test data into the memory cells;

reading the test data from the memory cells;

applying the read test data on the output terminals;

compressing the read test data to generate test signals;

concurrently applying the read test data and test signals on the output terminals;

determining the speed of the memory device from the test data written to and read from the memory cells; and detecting defects in the memory cells from the test signals.

8. The method of claim 7 wherein detecting defects in the memory cells from the test signals comprises latching the test signals after the read test data corresponding to the test signals has been applied on the output terminals and latched.

9. The method of claim 7 wherein compressing the read test data to generate test signals comprises comparing each bit of the read test data to the other bits of read test data and generating a test signal indicating whether all bits have the same logic state.

10. The method of claim 9 wherein comparing comprises performing a NAND function of the bits and performing a NOR function on the bits, and performing an XOR function of the results of the NAND and NOR function to generate the test signal.

* * * * *

UNITED STATES PATENT AND TRADEMARK OFFICE
CERTIFICATE OF CORRECTION

PATENT NO. : 6,550,026 B1
DATED : April 15, 2003
INVENTOR(S) : Jeffrey P. Wright, Hua Zheng and Paul M. Fuller It is certified that error appears in the above-identified patent and that said Letters Patent is hereby corrected as shown below:

<u>Title page, Item [54] and Column 1, line 2,</u>
Title, "HIGH SPEED TEST" should read -- HIGH-SPEED TEST --

<u>Column 1,</u>
Line 41, "string of 1 s, indicating" should read -- string of 1s, indicating --

<u>Column 5,</u>
Line 50, "include 110 circuits" should read -- include I/O circuits --

<u>Column 7,</u>
Line 36, "the speed the memory" should read -- the speed of the memory --

<u>Column 8,</u>
Line 4, "206 receives the data" should read -- 206 receive the data --

<u>Column 9,</u>
Line 28, "preferably consists of" should read -- preferably consist of --

Signed and Sealed this

Twenty-sixth Day of October, 2004

JON W. DUDAS
*Director of the United States Patent and Trademark Office*